US011621213B2

(12) United States Patent
Komo et al.

(10) Patent No.: US 11,621,213 B2
(45) Date of Patent: Apr. 4, 2023

(54) SEMICONDUCTOR DEVICE INCLUDING A SPRING PLATE

(71) Applicant: Mitsubishi Electric Corporation, Tokyo (JP)

(72) Inventors: Hideo Komo, Tokyo (JP); Takaaki Shirasawa, Tokyo (JP); Shintaro Araki, Tokyo (JP); Nobuyoshi Kimoto, Fukuoka (JP); Takeshi Omaru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 16/753,828

(22) PCT Filed: Dec. 1, 2017

(86) PCT No.: PCT/JP2017/043232
§ 371 (c)(1),
(2) Date: Apr. 6, 2020

(87) PCT Pub. No.: WO2019/106820
PCT Pub. Date: Jun. 6, 2019

(65) Prior Publication Data
US 2020/0286811 A1 Sep. 10, 2020

(51) Int. Cl.
H01L 23/40 (2006.01)
H01L 21/48 (2006.01)
H01L 23/473 (2006.01)

(52) U.S. Cl.
CPC ...... *H01L 23/4012* (2013.01); *H01L 21/4882* (2013.01); *H01L 23/473* (2013.01);
(Continued)

(58) Field of Classification Search
CPC .................................. H01L 23/4012
(Continued)

(56) References Cited

U.S. PATENT DOCUMENTS

2001/0033477 A1 10/2001 Inoue et al.
2002/0015288 A1* 2/2002 Dibene, II ......... H01R 12/7088
361/711
(Continued)

FOREIGN PATENT DOCUMENTS

JP 2005228919 A 8/2005
JP 2009076600 A 4/2009
(Continued)

OTHER PUBLICATIONS

An Office Action; "Notice of Reasons for Refusal," mailed by the Japanese Patent Office dated Mar. 16, 2021, which corresponds to Japanese Patent Application No. 2019-556506 and is related to U.S. Appl. No. 16/753,828 with English language translation.
(Continued)

*Primary Examiner* — Ajay Arora
(74) *Attorney, Agent, or Firm* — Studebaker & Brackett PC

(57) ABSTRACT

An object of the present invention is to provide a semiconductor device in which the effect of dimensional tolerance can be reduced, and a method for manufacturing the same. The semiconductor device according to the present invention includes: a plurality of cooling plates each having a coolant passage inside; spacers disposed to stack the cooling plates with spaces; at least one semiconductor package disposed on at least one principal surface of at least one of the cooling plates; and a spring plate disposed between adjacent ones of the cooling plates, the spring plate biasing the at least one semiconductor package toward the cooling plates.

21 Claims, 22 Drawing Sheets

(52) U.S. Cl.
CPC ............... *H01L 2023/4031* (2013.01); *H01L 2023/4068* (2013.01); *H01L 2023/4081* (2013.01)

(58) Field of Classification Search
USPC ........................................................ 257/713
See application file for complete search history.

(56) References Cited

U.S. PATENT DOCUMENTS

| | | | |
|---|---|---|---|
| 2004/0099944 A1* | 5/2004 | Kimura | H01L 23/4334 257/E23.092 |
| 2006/0162365 A1* | 7/2006 | Hoang | F25B 39/02 62/310 |
| 2006/0238984 A1* | 10/2006 | Belady | H01L 23/367 361/704 |
| 2012/0119256 A1* | 5/2012 | Okita | H01L 25/072 257/140 |

FOREIGN PATENT DOCUMENTS

| | | | |
|---|---|---|---|
| JP | 2009212137 A | 9/2009 | |
| JP | 2012004358 A | 1/2012 | |
| JP | 2013026368 A | 2/2013 | |
| JP | 2013187334 A | 9/2013 | |
| JP | 2013-243323 A | 12/2013 | |
| JP | 2014033119 A | 2/2014 | |
| JP | 2014056853 A | 3/2014 | |
| JP | 2015-133433 A | 7/2015 | |
| JP | 2017-199829 A | 11/2017 | |
| WO | WO-2015037537 A1 * | 3/2015 | ............. H02M 1/08 |

OTHER PUBLICATIONS

An Office Action; "Notice of Reasons for Refusal," mailed by the Japanese Patent Office dated Nov. 4, 2020, which corresponds to Japanese Patent Application No. 2019-556506 and is related to U.S. Appl. No. 16/753,828 with English language translation.

International Search Report issued in PCT/JP2017/043232; dated Feb. 13, 2018.

An Office Action, "Decision of Refusal", mailed by the Japanese Patent Office dated Oct. 5, 2021, which corresponds to Japanese Patent Application No. 2019-556506 and is related to U.S. Appl. No. 16/753,828; with English language translation.

An Office Action issued by the German Patent and Trademark Office dated Jun. 9, 2022, which corresponds to German Patent Application No. 112017008242.0 and is related to U.S. Appl. No. 16/753,828; with English language translation.

* cited by examiner

F I G. 3
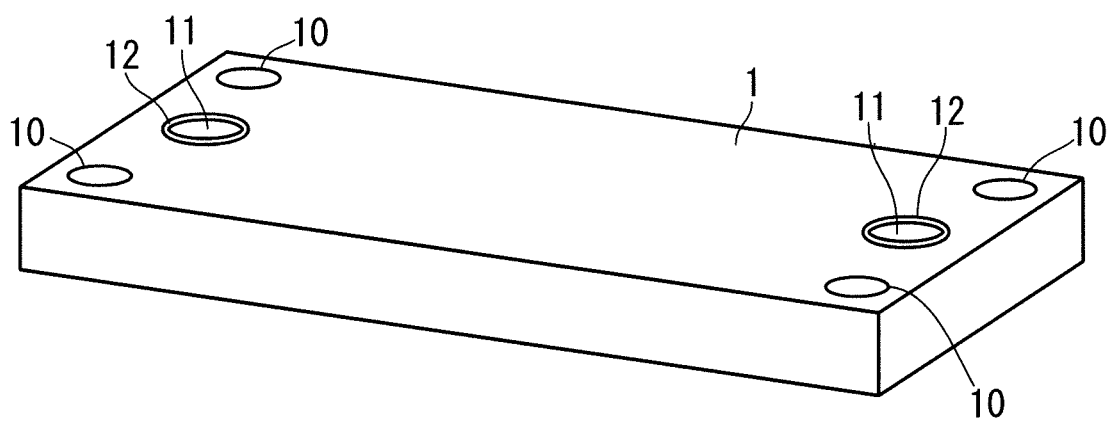

F I G. 17
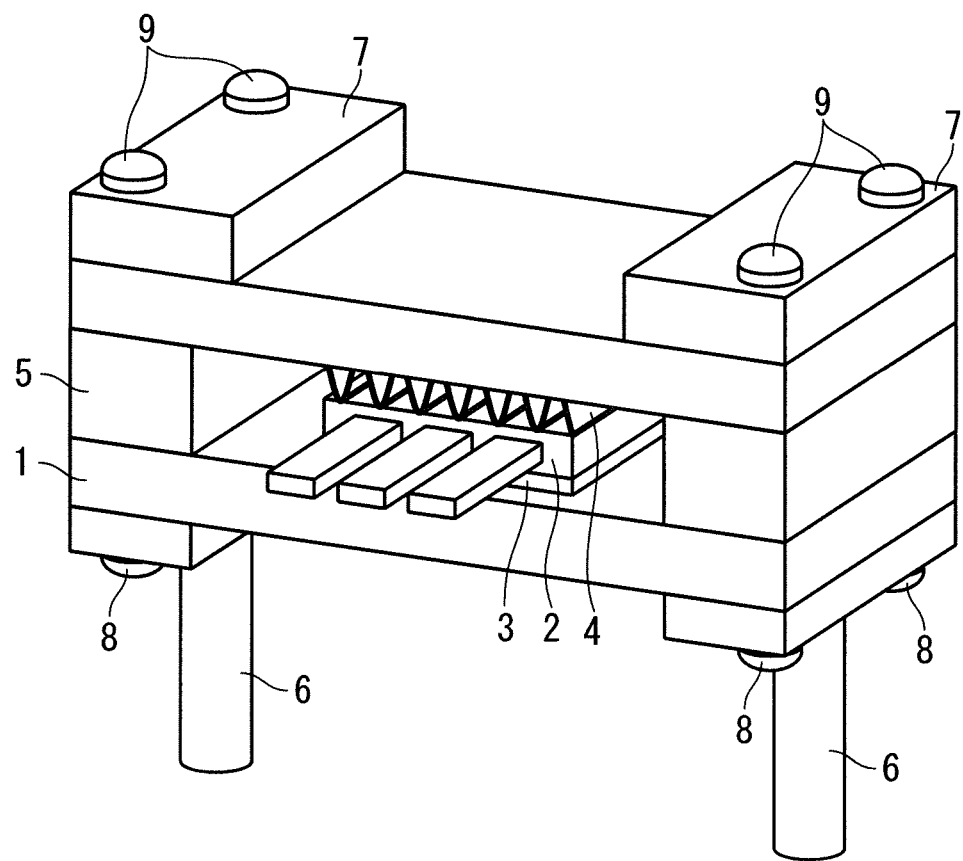

F I G. 2 2
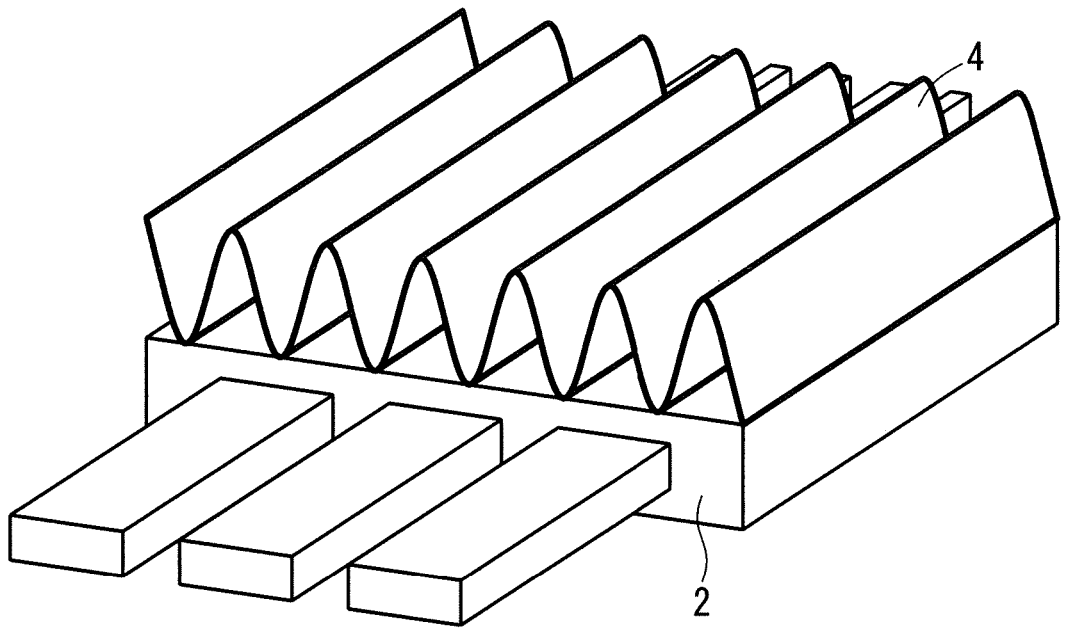
F I G. 2 3
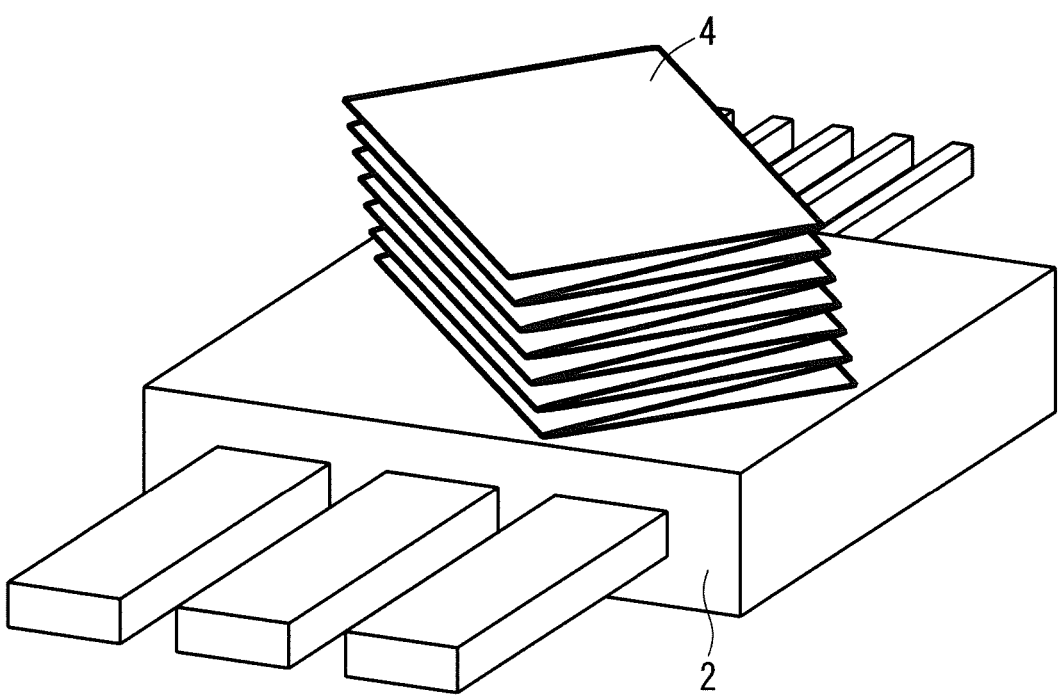

SEMICONDUCTOR DEVICE INCLUDING A SPRING PLATE

TECHNICAL FIELD

The present invention relates to a semiconductor device and a method for manufacturing the same, and in particular to a structure of a semiconductor device to be used for a power controller, etc., and a method for manufacturing the same.

BACKGROUND ART

Conventionally disclosed is a semiconductor device including: a plurality of cooling pipes each having a coolant passage inside; semiconductor packages each of which is fixed to one principal surface of the cooling pipe; seal spacer parts disposed to stack the plurality of cooling pipes with spaces as a shelf-like cooling structure for maintaining the airtightness at ends of the cooling structure; and headers respectively provided at one end and the other end of the cooling structure and each of which has one opening that is used for taking in and out a coolant to and from the corresponding cooling pipe and that is connected with the seal spacer parts in an airtight manner.

PRIOR ART DOCUMENT

Patent Document

[Patent Document 1] Japanese Patent Application Laid-Open No. 2013-26368

SUMMARY

Problem to be Solved by the Invention

In Patent Document 1, when the semiconductor devices are fabricated, the cooling pipes may be deformed due to the effect of dimensional tolerance of components included in each of the semiconductor devices.

The present invention has been conceived to solve such a problem, and has an object of providing a semiconductor device in which the effect of dimensional tolerance can be reduced, and a method for manufacturing the same.

Means to Solve the Problem

To solve the problem, the semiconductor device according to the present invention includes: a plurality of cooling plates each having a coolant passage inside; spacers disposed to stack the cooling plates with spaces; at least one semiconductor package disposed on at least one principal surface of at least one of the cooling plates; and a spring plate disposed between adjacent ones of the cooling plates, the spring plate biasing the at least one semiconductor package toward the cooling plates.

Effects of the Invention

The semiconductor device according to the present invention includes: a plurality of cooling plates each having a coolant passage inside; spacers disposed to stack the cooling plates with spaces; at least one semiconductor package disposed on at least one principal surface of at least one of the cooling plates; and a spring plate disposed between adjacent ones of the cooling plates, the spring plate biasing the at least one semiconductor package toward the cooling plates. Thus, the effect of dimensional tolerance can be reduced.

The object, features, aspects and advantages of the present invention will become more apparent from the following detailed description and the accompanying drawings.

BRIEF DESCRIPTION OF DRAWINGS

FIG. 3 illustrates an example cooling plate according to the embodiment of the present invention.

FIG. 17 illustrates an example structure of the semiconductor device according to the embodiment of the present invention.

FIG. 22 illustrates an example positioning of the spring plate according to the embodiment of the present invention.

FIG. 23 illustrates an example positioning of the spring plate according to the embodiment of the present invention.

DESCRIPTION OF EMBODIMENTS

An embodiment of the present invention will be hereinafter described based on the drawings.

Embodiment

Structure

Figure 1:
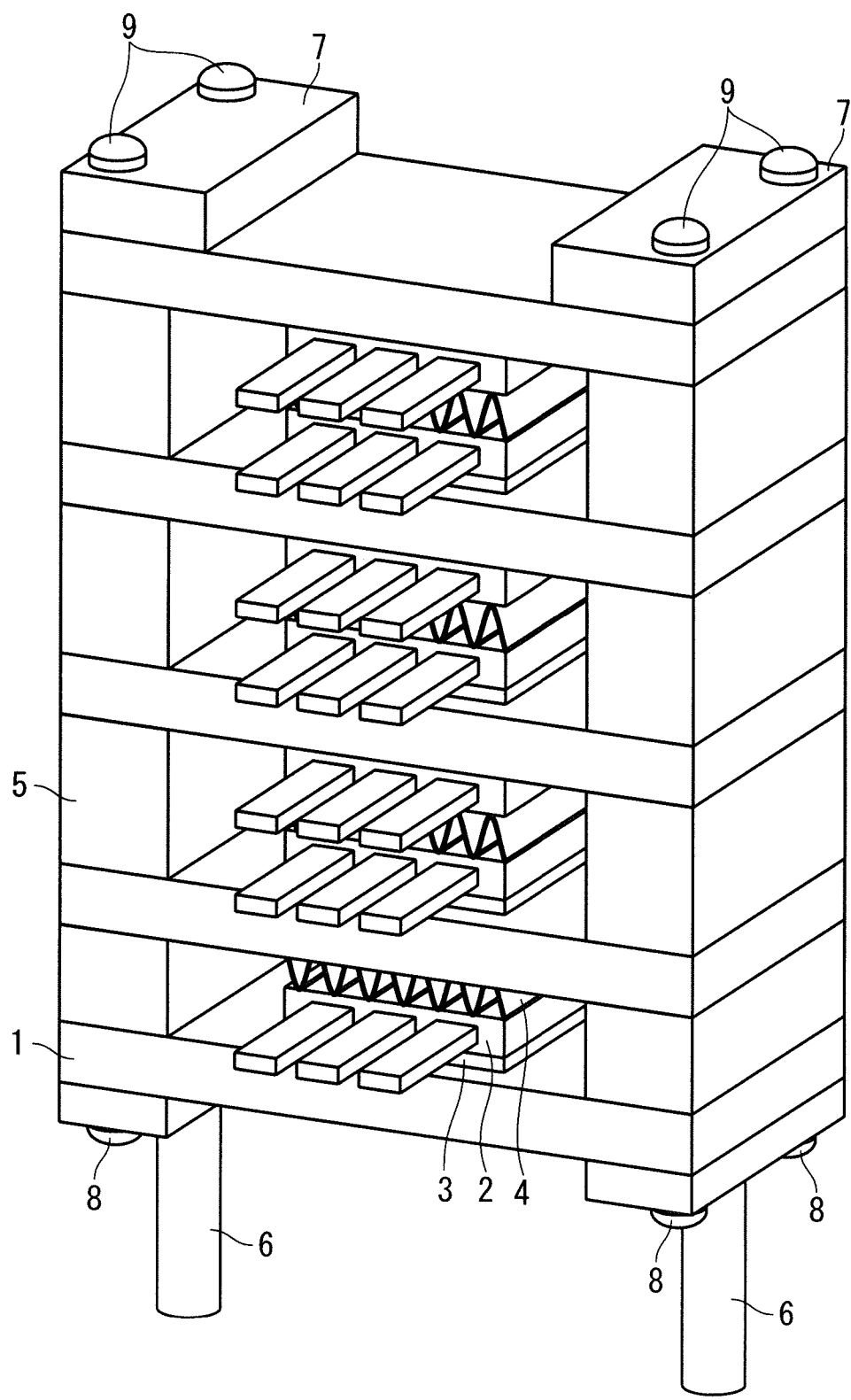
FIG. 1 illustrates an example structure of a semiconductor device according to an embodiment of the present invention.
Figure 2:
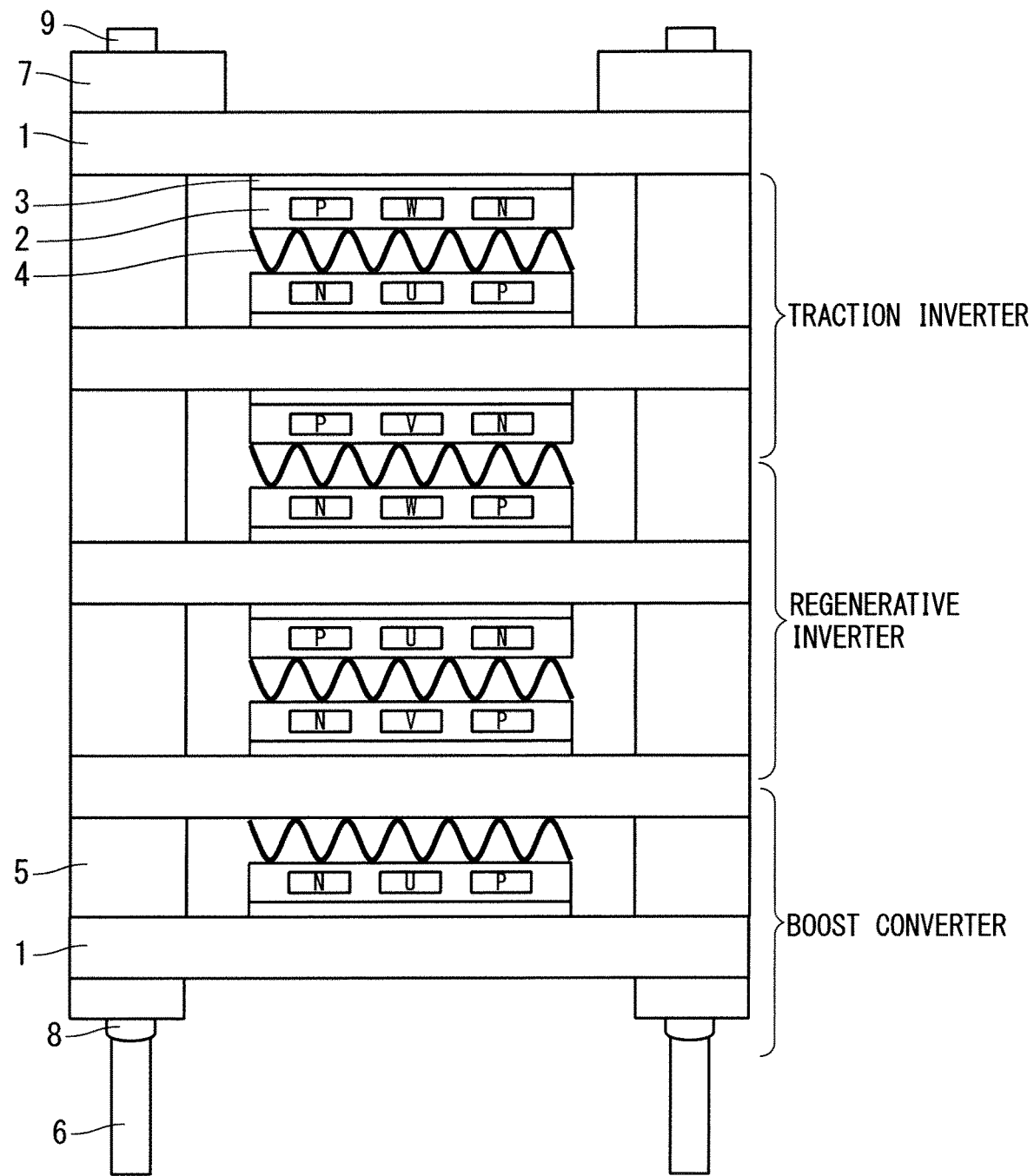
FIG. 2 illustrates the example structure of the semiconductor device according to the embodiment of the present invention.

FIGS. 1 and 2 illustrate an example structure of a semiconductor device according to the embodiment of the present invention.

As illustrated in FIGS. 1 and 2, the semiconductor device includes cooling plates 1, semiconductor packages 2, thermal grease 3, spring plates 4, spacers 5, pipes 6, lids 7, screws 8, and nuts 9.

Figure 4:
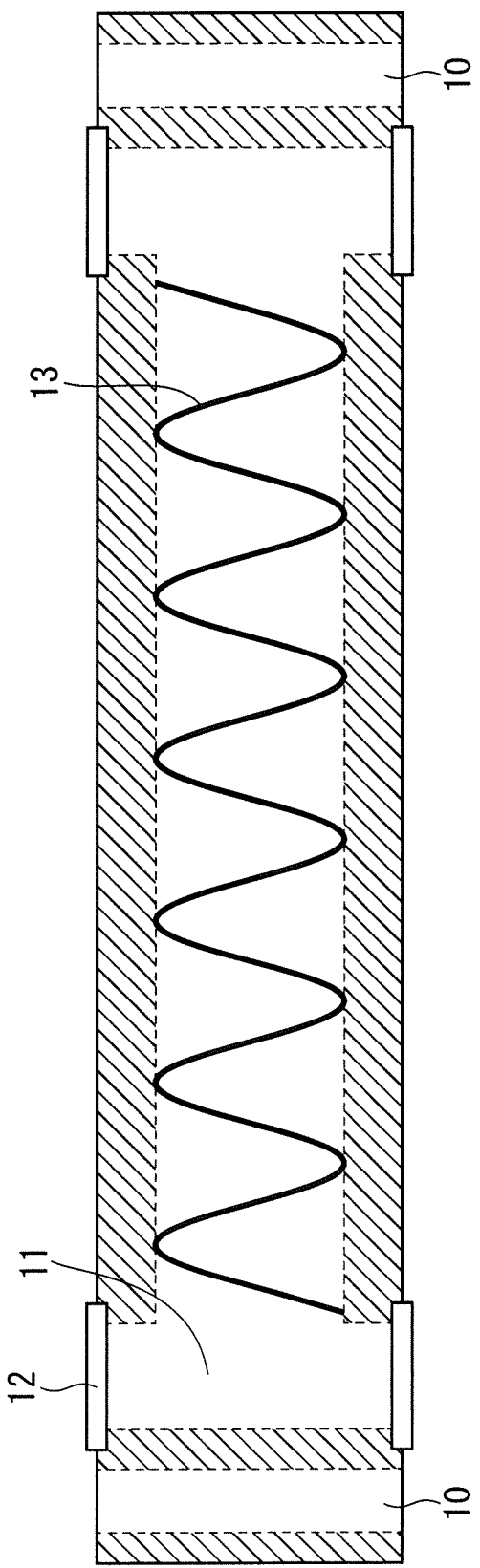
FIG. 4 illustrates the example cooling plate according to the embodiment of the present invention.

As illustrated in FIGS. 3 and 4, the cooling plate 1 includes screw holes 10 into which the screws 8 are inserted, and coolant passages 11 through which a coolant such as water passes. Specifically, the cooling plate 1 includes the coolant passages 11 in a stacking direction of the cooling plates 1 and in a direction vertical to the stacking direction. The coolant passages 11 include a cooling fin 13 for improving the cooling efficiency. O-rings 12 are disposed on the coolant passages 11. In the example of FIGS. 1 and 2, five of the cooling plates 1 are stacked with spaces therebetween. The highest and lowest cooling plates 1 among the cooling plates 1 need to be more rigid than the other cooling plates 1 to prevent deformation when the screws 8 are tightened with the nuts 9. For example, the highest and lowest cooling plates 1 are made of an aluminum alloy, and the other cooling plates 1 are made of thin pure aluminum. The use of these materials can yield the thermal resistance appropriate for cooling the semiconductor packages 2.

Figure 5:
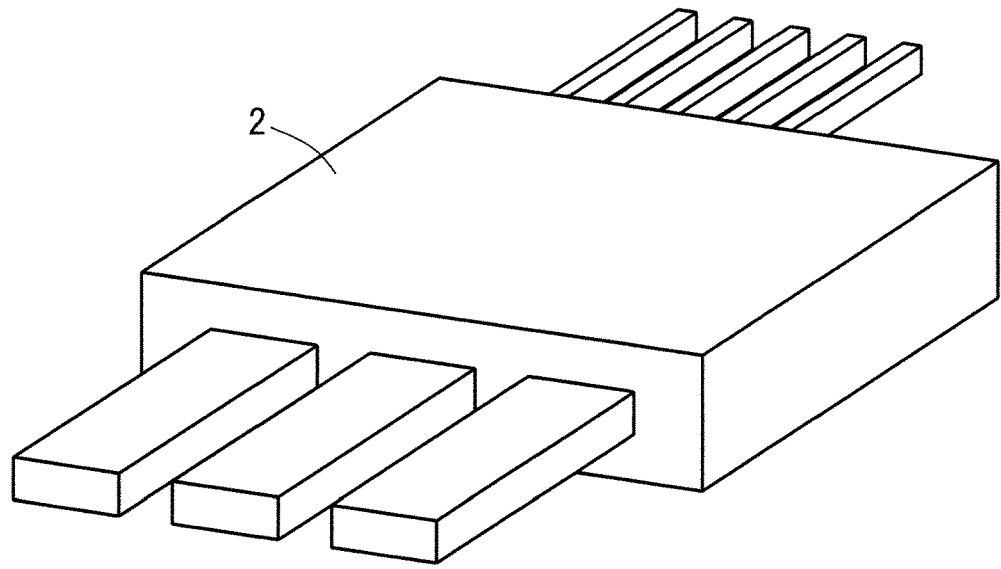
FIG. 5 illustrates an example semiconductor package according to the embodiment of the present invention.

As illustrated in FIG. 5, the semiconductor package 2 is a 2-in-1 package of a molded power module having an insulated gate bipolar transistor (IGBT) and a free wheeling diode (FWD) inside. In other words, the semiconductor package 2 is a 2-in-1 package including an upper arm circuit and a lower arm circuit. The semiconductor package 2 is disposed on the cooling plate 1 through the thermal grease 3. The thermal grease 3 has a function of dissipating the heat generated in the semiconductor package 2 to the cooling plate 1. In the example of FIGS. 1 and 2, the semiconductor packages 2 are disposed on the lower surface of the highest cooling plate 1 and on the upper surfaces of the lowest cooling plate 1 and the second lowest cooling plate 1. Furthermore, the semiconductor packages 2 are disposed on both surfaces of the other cooling plates 1.

Figure 6:
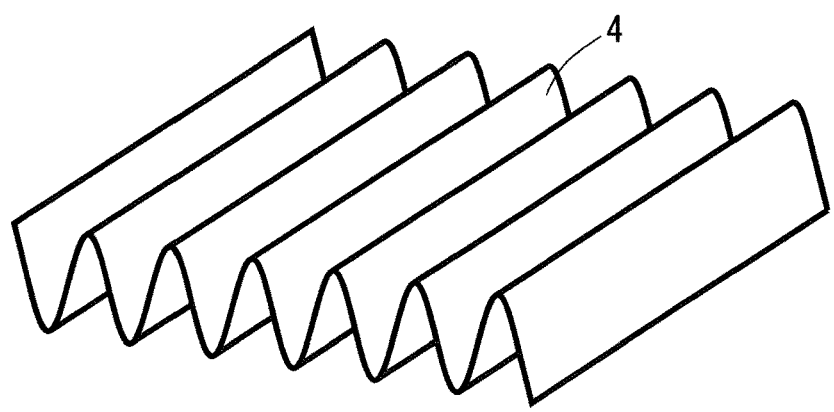
FIG. 6 illustrates an example spring plate according to the embodiment of the present invention.

The spring plates 4 are disposed between the adjacent cooling plates 1, and biases the semiconductor packages 2 toward the cooling plates 1. In the example of FIGS. 1 and 2, the spring plate 4 is disposed between the second lowest cooling plate 1 and the semiconductor package 2, and the spring plates 4 are disposed between the semiconductor packages 2 in the other portions. As illustrated in FIG. 6, the spring plate 4 is corrugated.

Figure 7:
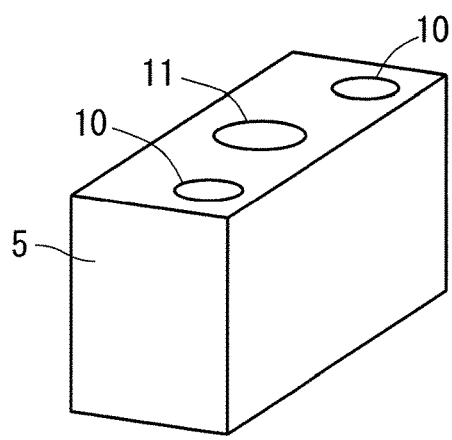
FIG. 7 illustrates an example spacer according to the embodiment of the present invention.

As illustrated in FIG. 7, the spacer 5 includes the screw holes 10 and the coolant passage 11. Furthermore, the spacers 5 are disposed to space the adjacent cooling plates 1. In other words, the spacers 5 are disposed to stack the cooling plates 1 with spaces.

Figure 8:
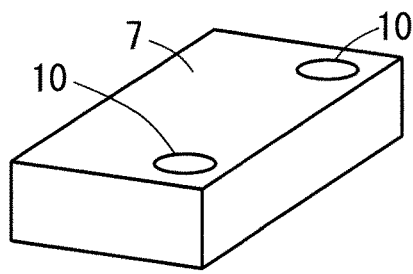
FIG. 8 illustrates an example lid according to the embodiment of the present invention.
Figure 9:
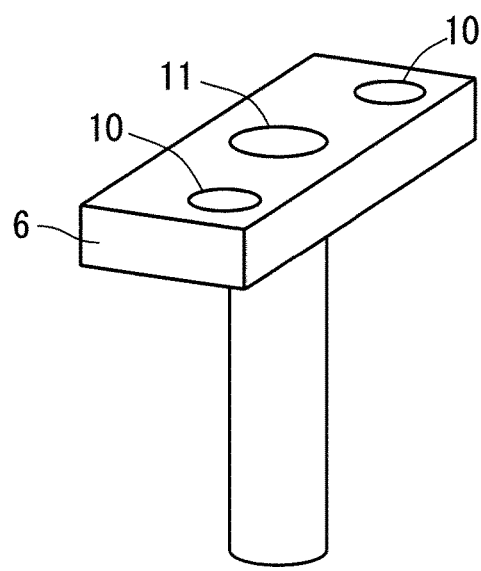
FIG. 9 illustrates an example pipe according to the embodiment of the present invention.

As illustrated in FIG. 8, the lid 7 includes the screw holes 10, and blocks the coolant passages 11 disposed in the cooling plates 1. As illustrated in FIG. 9, the pipe 6 includes the screw holes 10 and the coolant passage 11, and functions as an inlet and an outlet of the coolant. In the examples of FIGS. 1 and 2, upon flowing into one of the pipes 6, the coolant passes through the coolant passages of the cooling plates 1 and the spacers 5, and flows from the other pipe 6. This can efficiently reduce the heat generated in the semiconductor packages 2.

Each of the screws 8 passes through the screw holes 10 of the pipe 6, the cooling plates 1, the spacers 5, and the lid 7, and is tightened with the nut 9 to fix the pipe 6, the cooling plates 1, the spacers 5, and the lid 7.

Manufacturing Method

FIGS. 10 to 15 illustrate example manufacturing processes of the semiconductor device according to the embodiment.

Figure 10:
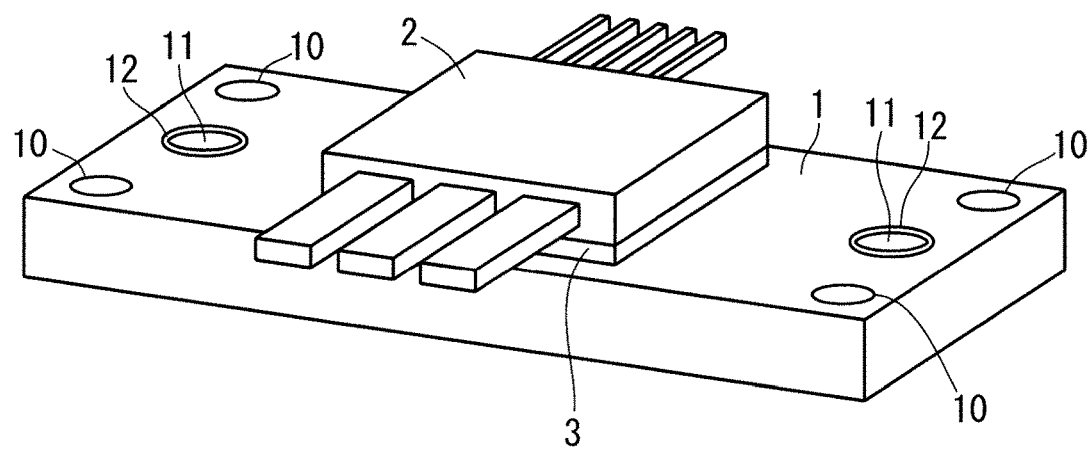
FIG. 10 illustrates an example manufacturing process of the semiconductor device according to the embodiment of the present invention.
Figure 11:
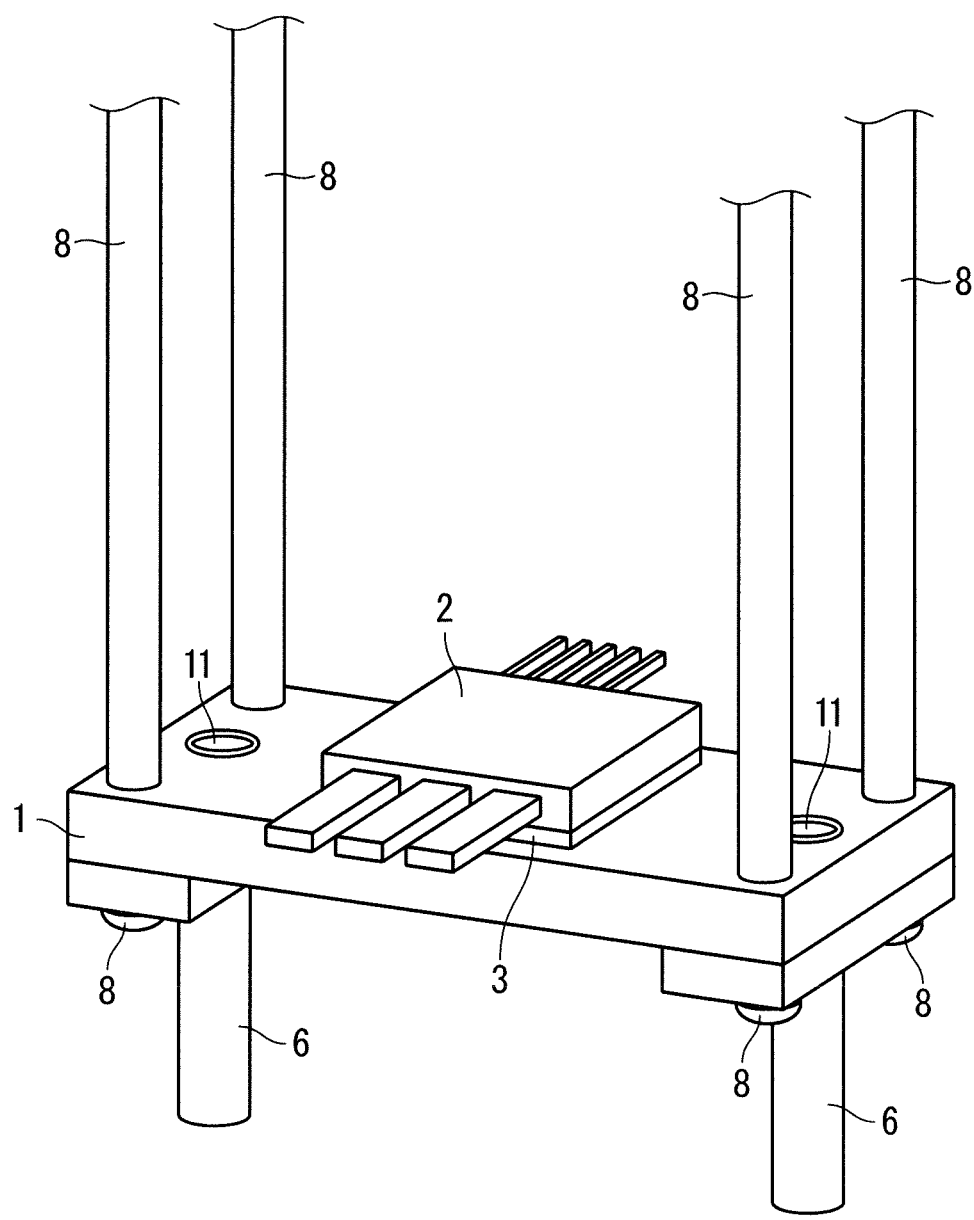
FIG. 11 illustrates an example manufacturing process of the semiconductor device according to the embodiment of the present invention.

As illustrated in FIG. 10, the semiconductor package 2 is disposed on the upper surface of the cooling plate 1 through the thermal grease 3. Next as illustrated in FIG. 11, the pipes 6 are disposed on the lower surface of the cooling plate 1, and the screws 8 are inserted into the screw holes 10 of the cooling plates 1 and the pipes 6.

Figure 12:
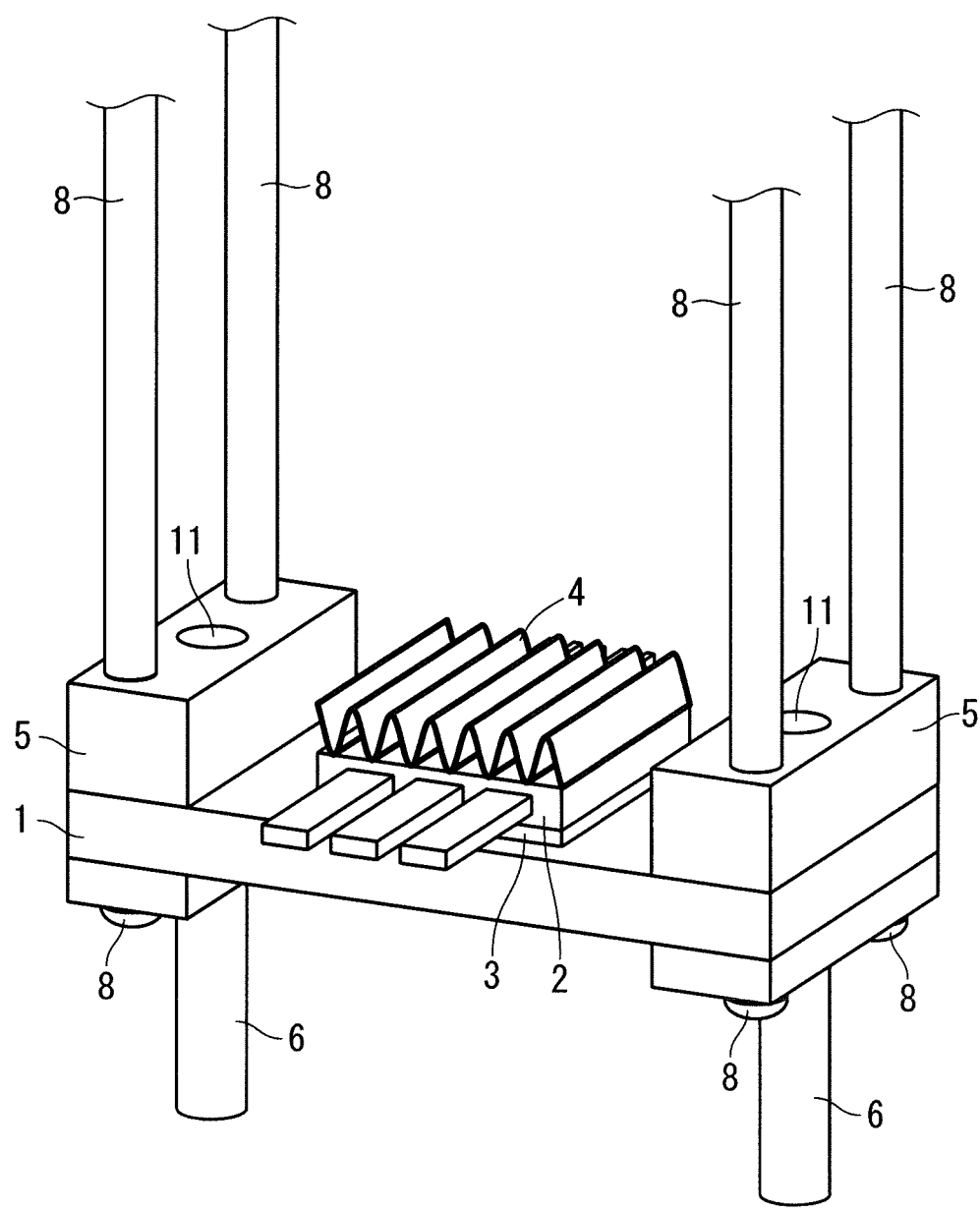
FIG. 12 illustrates an example manufacturing process of the semiconductor device according to the embodiment of the present invention.

Next as illustrated in FIG. 12, the spring plate 4 is disposed on the semiconductor package 2. Furthermore, the screws 8 are inserted into the screw holes 10 of the spacers 5 to place the spacers 5 on the cooling plate 1.

Figure 13:
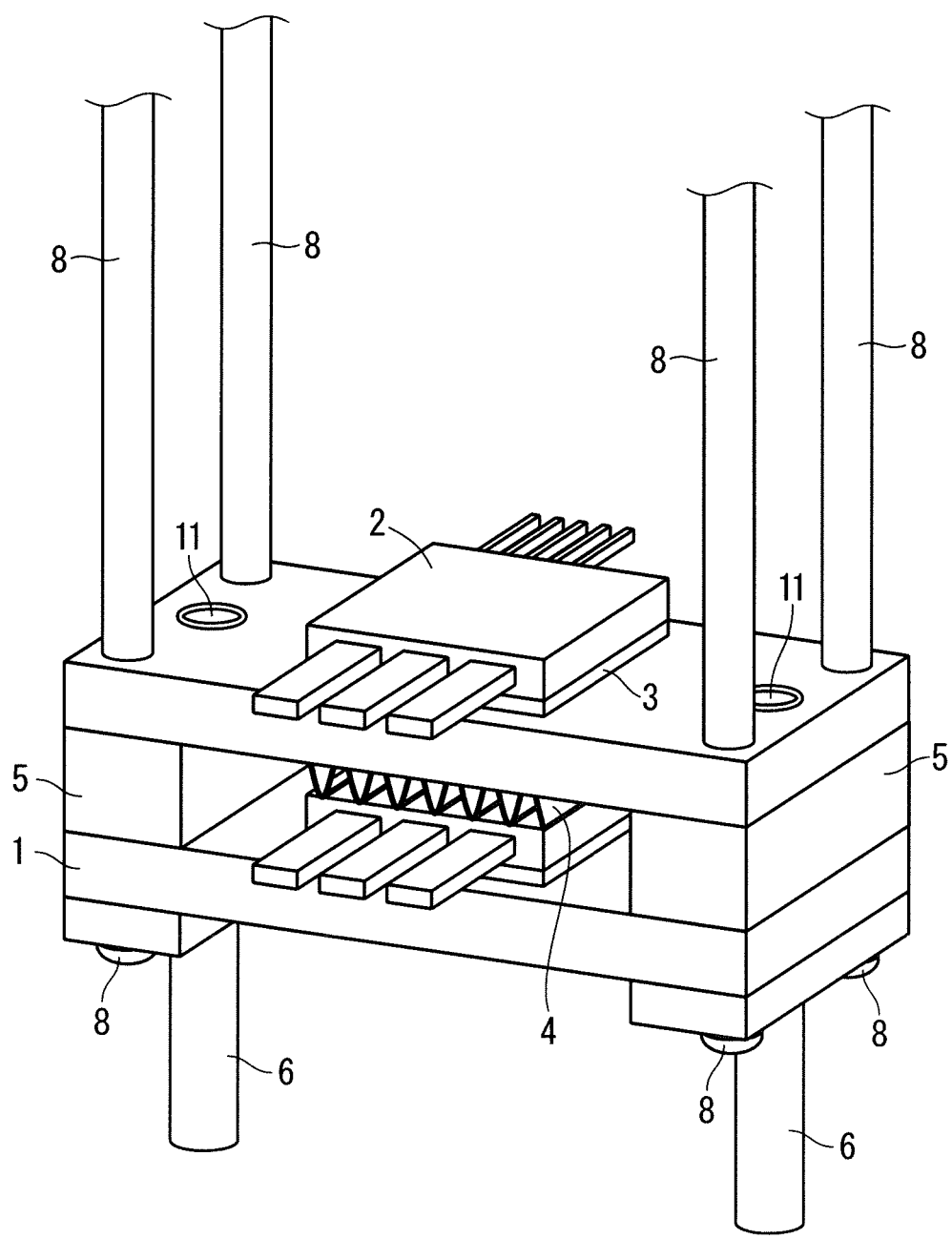
FIG. 13 illustrates an example manufacturing process of the semiconductor device according to the embodiment of the present invention.

Next as illustrated in FIG. 13, the semiconductor package 2 is disposed on the upper surface of the cooling plate 1 through the thermal grease 3. Furthermore, the screws 8 are inserted into the screw holes 10 of the cooling plate 1 to place the cooling plate 1 on the spacers 5 and the spring plate 4. Then, the spring plate 4 is disposed on the semiconductor package 2. Furthermore, the screws 8 are inserted into the screw holes 10 of the spacers 5 to place the spacers 5 on the cooling plate 1.

Next, the semiconductor packages 2 are disposed on both surfaces of the cooling plate 1 through the thermal grease 3. Then, the screws 8 are inserted into the screw holes 10 of the cooling plate 1 to place the cooling plate 1 on the spacers 5 and the spring plate 4. Then, the spring plate 4 is disposed on the semiconductor package 2. Furthermore, the screws 8 are inserted into the screw holes 10 of the spacers 5 to place the spacers 5 on the cooling plate 1. This is repeated twice.

Figure 14:
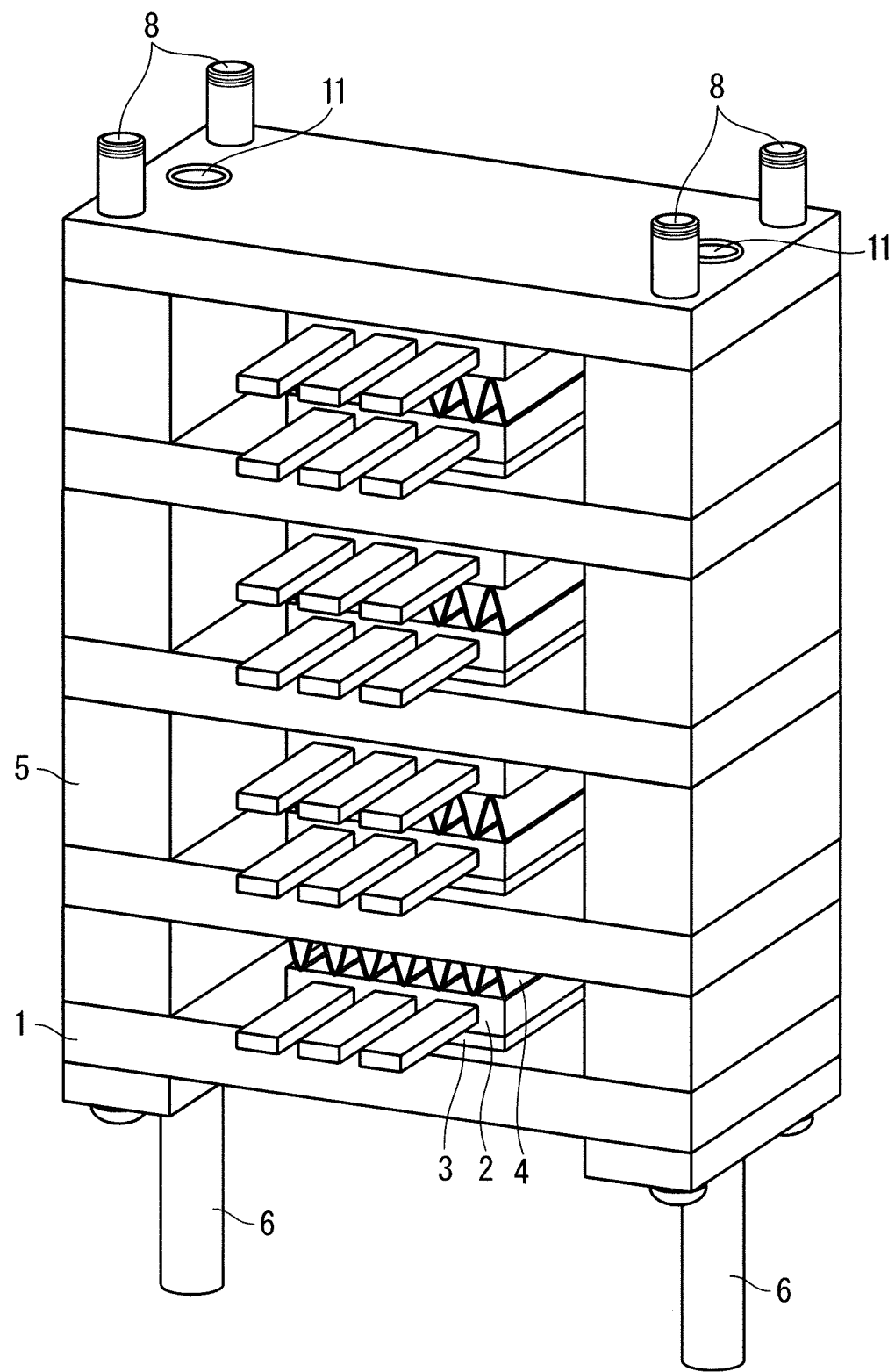
FIG. 14 illustrates an example manufacturing process of the semiconductor device according to the embodiment of the present invention.

Next, the semiconductor package 2 is disposed on the lower surface of the cooling plate 1 through the thermal grease 3. Then, the screws 8 are inserted into the screw holes 10 of the cooling plate 1 to place the cooling plate 1 on the spacers 5 and the spring plate 4. FIG. 14 illustrates the state obtained through these processes.

Figure 15:
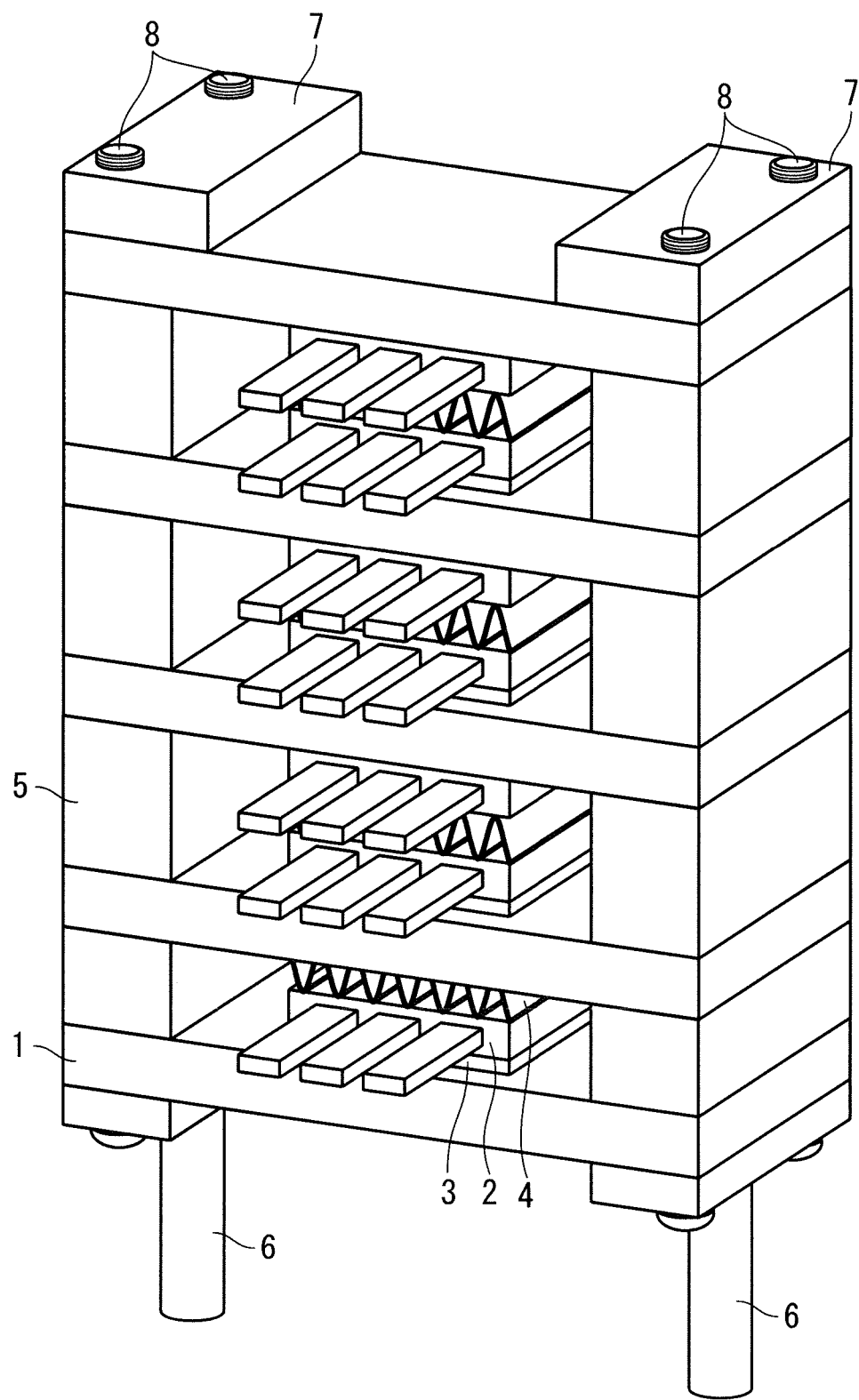
FIG. 15 illustrates an example manufacturing process of the semiconductor device according to the embodiment of the present invention.

Next as illustrated in FIG. 15, the screws 8 are inserted into the screw holes 10 of the lids 7 to place the lids 7 on the upper surface of the cooling plate 1. Finally, the nuts 9 are tightened at the ends of the screws 8. This fixes the pipes 6, the cooling plates 1, the spacers 5, and the lids 7. Here, the coolant passages 11 of the cooling plates 1 are joined to the coolant passages 11 of the spacers 5 through the O-rings 12. Tightening the nuts 9 gives the pressure on the O-rings 12. This can maintain the airtightness of the coolant passages 11 at the junction portions between the cooling plates 1 and the spacers 5.

Through these manufacturing processes, a semiconductor device with a stacked structure is completed as illustrated in FIGS. 1 and 2. In the example of FIGS. 1 and 2, the semiconductor device is a 14-in-1 semiconductor device including two elements composing a boost converter, six elements composing a regenerative inverter, and six elements composing a traction inverter.

Since the spring plates 4 are disposed between the adjacent cooling plates 1 according to the embodiment, the effect of dimensional tolerance in the semiconductor device with the stacked structure can be reduced.

MODIFICATIONS

The modifications of the semiconductor device according to the embodiment will be described.

Modification 1

Although the semiconductor package 2 is described as a 2-in-1 package including an upper arm circuit and a lower arm circuit in FIGS. 1 and 2, the semiconductor package 2 is not limited to this.

Figure 16:
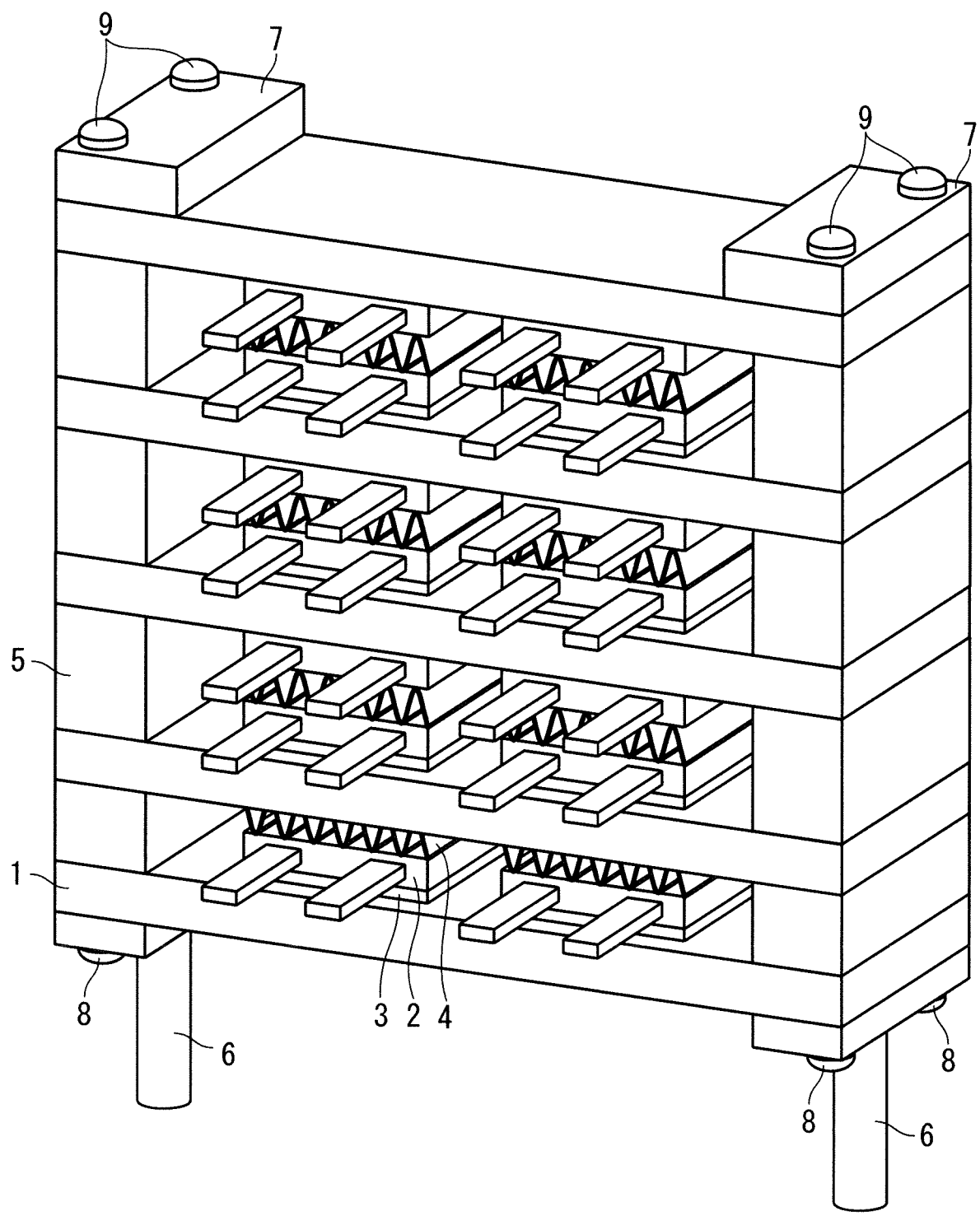
FIG. 16 illustrates an example structure of the semiconductor device according to the embodiment of the present invention.

As illustrated in FIG. 16, the semiconductor package 2 may be, for example, a 1-in-1 package including one of the upper arm circuit and the lower arm circuit. The structure of the semiconductor package 2 is arbitrarily selectable.

Modification 2

Figure 18:
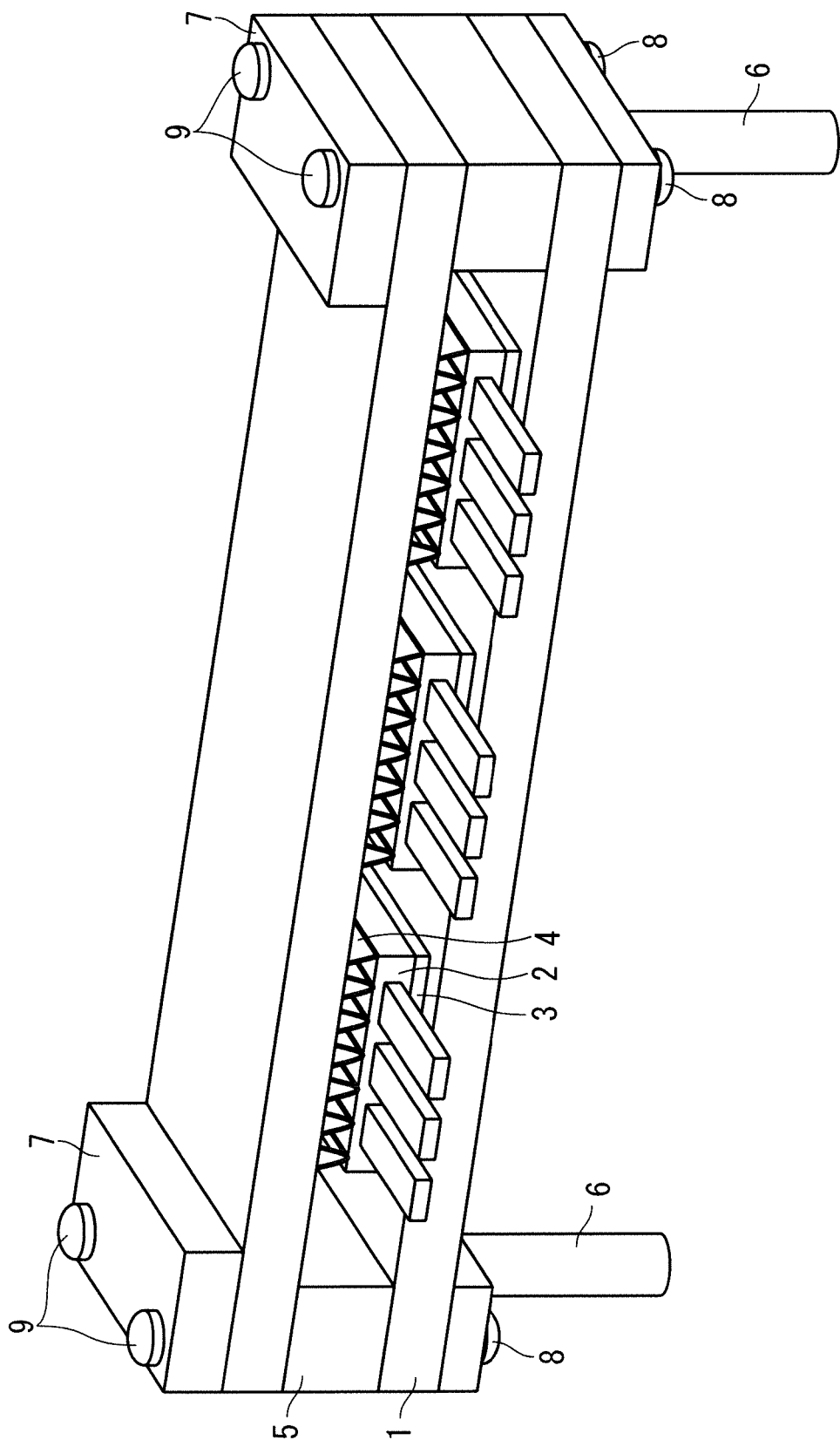
FIG. 18 illustrates an example structure of the semiconductor device according to the embodiment of the present invention.
Figure 19:
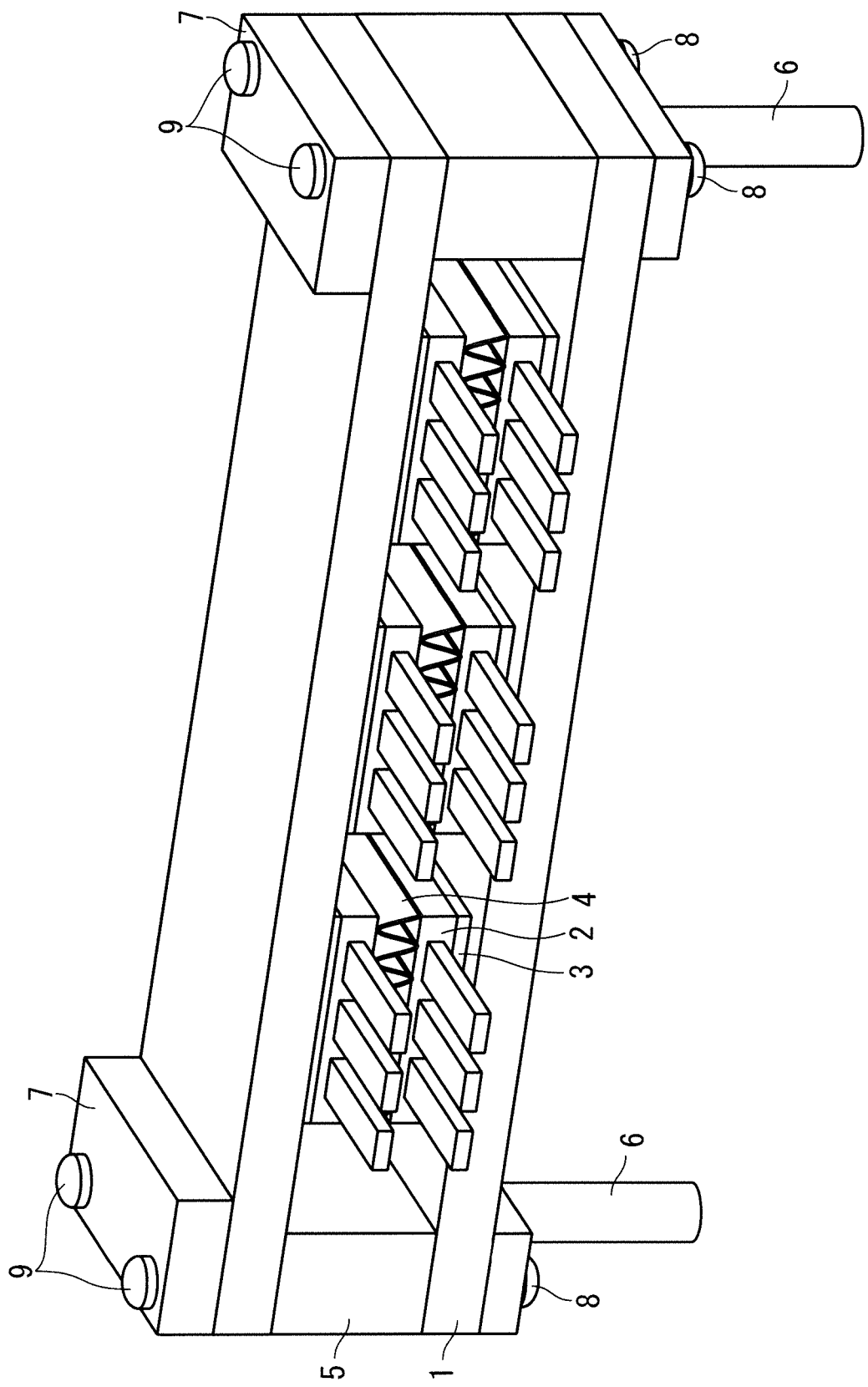
FIG. 19 illustrates an example structure of the semiconductor device according to the embodiment of the present invention.

The number of the semiconductor packages 2 disposed on the cooling plates 1 may be one or more. As illustrated in FIG. 17, disposing, for example, the one semiconductor package 2 on the cooling plate 1 can achieve a 2-in-1 semiconductor device including a boost converter. As illustrated in FIG. 18, disposing, for example, the three semiconductor packages 2 on the cooling plate 1 can achieve a 6-in-1 semiconductor device including a traction inverter or a regenerative inverter. As illustrated in FIG. 19, disposing, for example, the three semiconductor packages 2 on the upper surface of the lower cooling plate 1 and the three semiconductor packages 2 on the lower surface of the upper cooling plate 1 can achieve a 12-in-1 semiconductor device including a traction inverter and a regenerative inverter. As such, the structure of the semiconductor packages 2 and how to dispose the semiconductor packages 2 on the cooling plates 1 are arbitrarily selectable.

Although FIGS. 17 to 19 illustrate a structure in which the two cooling plates 1 are stacked, the structure is not limited to this. The stacked structure may be, for example, a combined structure of FIGS. 17 and 18 or a combined structure of FIGS. 17 and 19.

Modification 3

Figure 20:
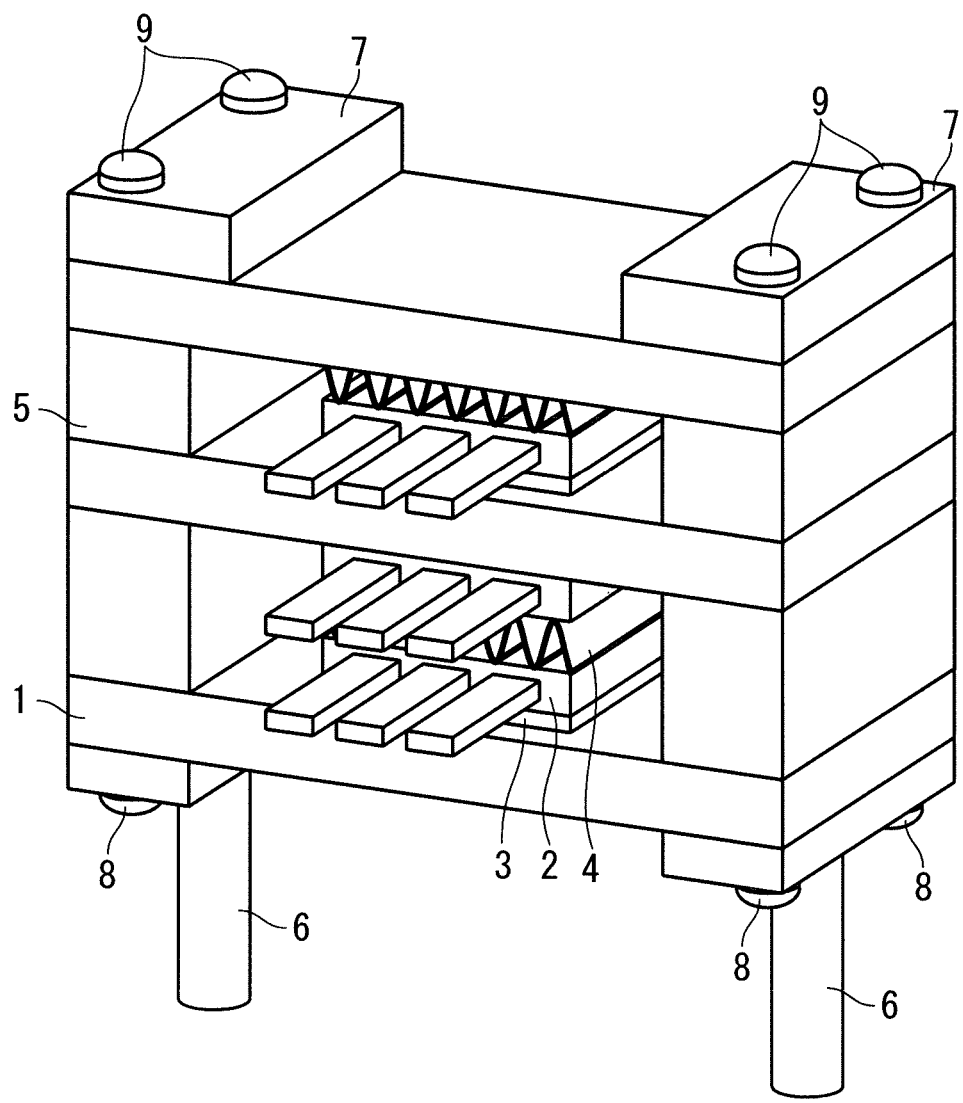
FIG. 20 illustrates an example structure of the semiconductor device according to the embodiment of the present invention.
Figure 21:
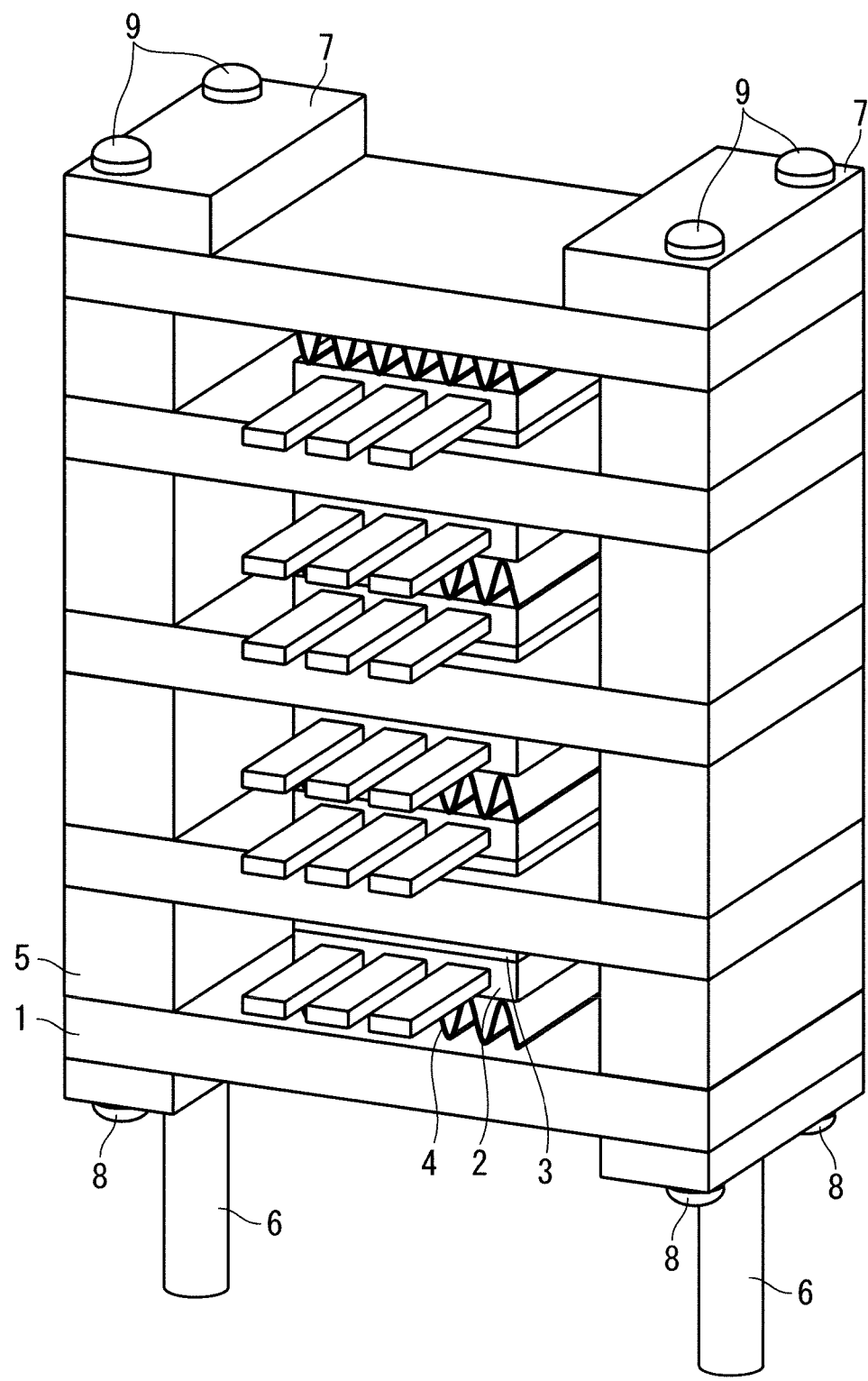
FIG. 21 illustrates an example structure of the semiconductor device according to the embodiment of the present invention.

The number of the semiconductor packages 2 to be stacked is selectable without restraint. In other words, the number of the cooling plates 1 to be stacked may be variable. As illustrated in FIG. 20, for example, the 6-in-1 semiconductor device including a traction inverter or a regenerative inverter can be achieved. As illustrated in FIG. 21, the 12-in-1 semiconductor device including a traction inverter and a regenerative inverter can also be achieved.

Modification 4

The semiconductor package 2 may have an insulating layer such as an insulation sheet inside. This can insulate the semiconductor package 2 from the cooling plate 1.

Furthermore, an insulating substrate may be disposed outside the semiconductor package 2, that is, between the semiconductor package 2 and the cooling plate 1. This can insulate the semiconductor package 2 from the cooling plate 1.

Modification 5

The spring plate 4 may be disposed in any position. As illustrated in FIG. 22, for example, the spring plate 4 may be corrugated in a direction vertical to the stacking direction of the cooling plates 1. As illustrated in FIG. 23, the spring plate 4 may be corrugated in a direction parallel to the stacking direction of the cooling plates 1.

Modification 6

Figure 24:
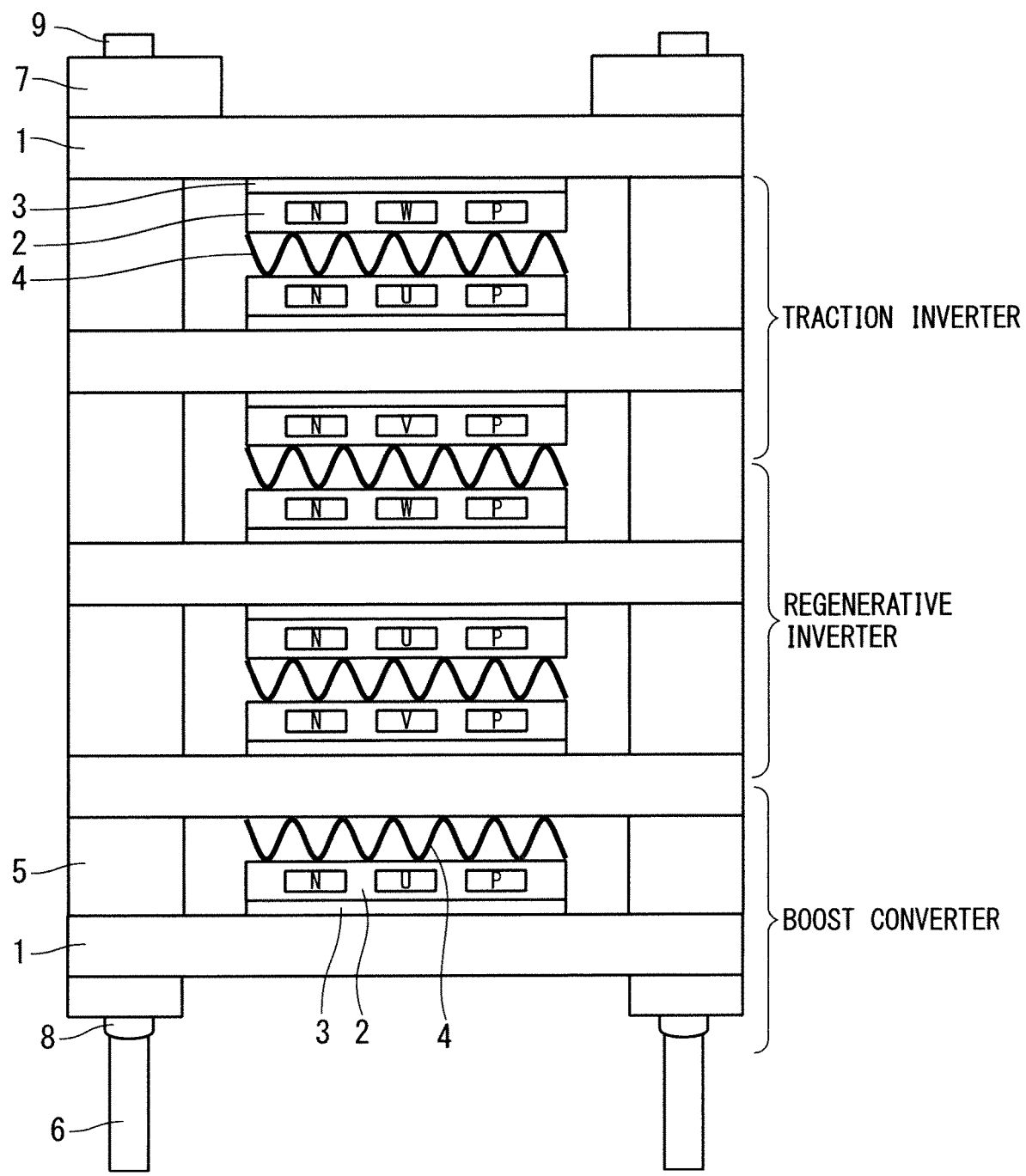
FIG. 24 illustrates an example structure of the semiconductor device according to the embodiment of the present invention.

As illustrated in FIG. 24, an arrangement of the main terminals of the semiconductor packages 2 can be of a mirror type. Since the main terminals of the semiconductor packages 2 including the semiconductor packages 2 of the mirror type can be aligned in the stacking direction, the arrangement of the main terminals of the semiconductor packages 2 can be optimized.

Modification 7

Figure 25:
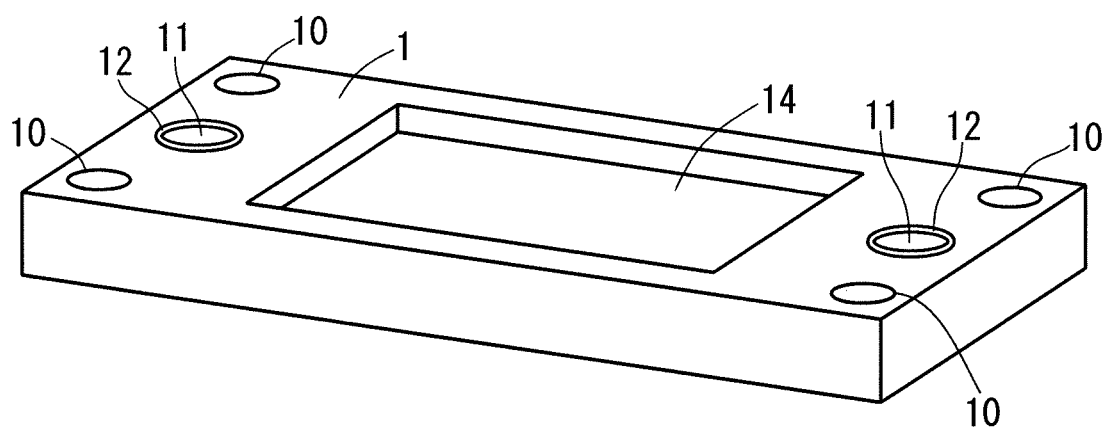
FIG. 25 illustrates an example cooling plate according to the embodiment of the present invention.

As illustrated in FIG. 25, the cooling plate 1 may include a recess 14. In other words, the cooling plate 1 may include the recess 14 with a surface on which the semiconductor package 2 is disposed and to which the thermal grease 3 is applied. This structure can prevent the thermal grease 3 from pumping out.

Modification 8

Figure 26:
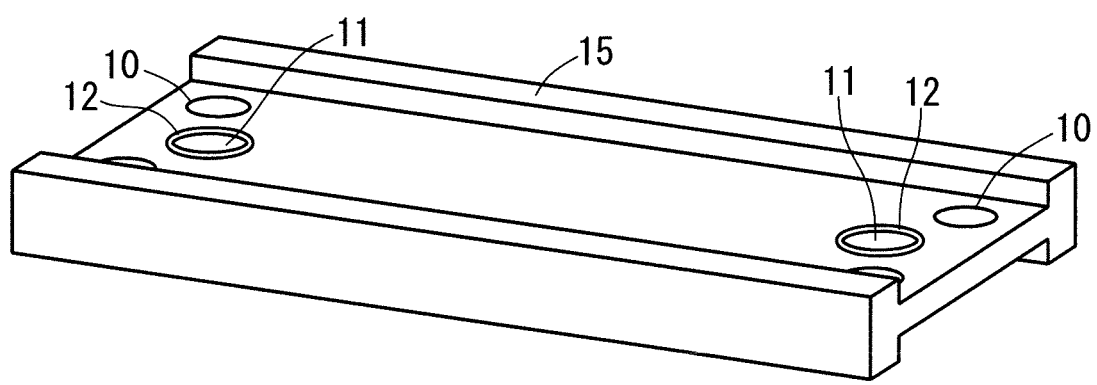
FIG. 26 illustrates an example cooling plate according to the embodiment of the present invention.

As illustrated in FIG. 26, the cooling plate 1 may include ribs 15. This structure can increase the mechanical strength of the cooling plate 1.

Modification 9

Figure 27:
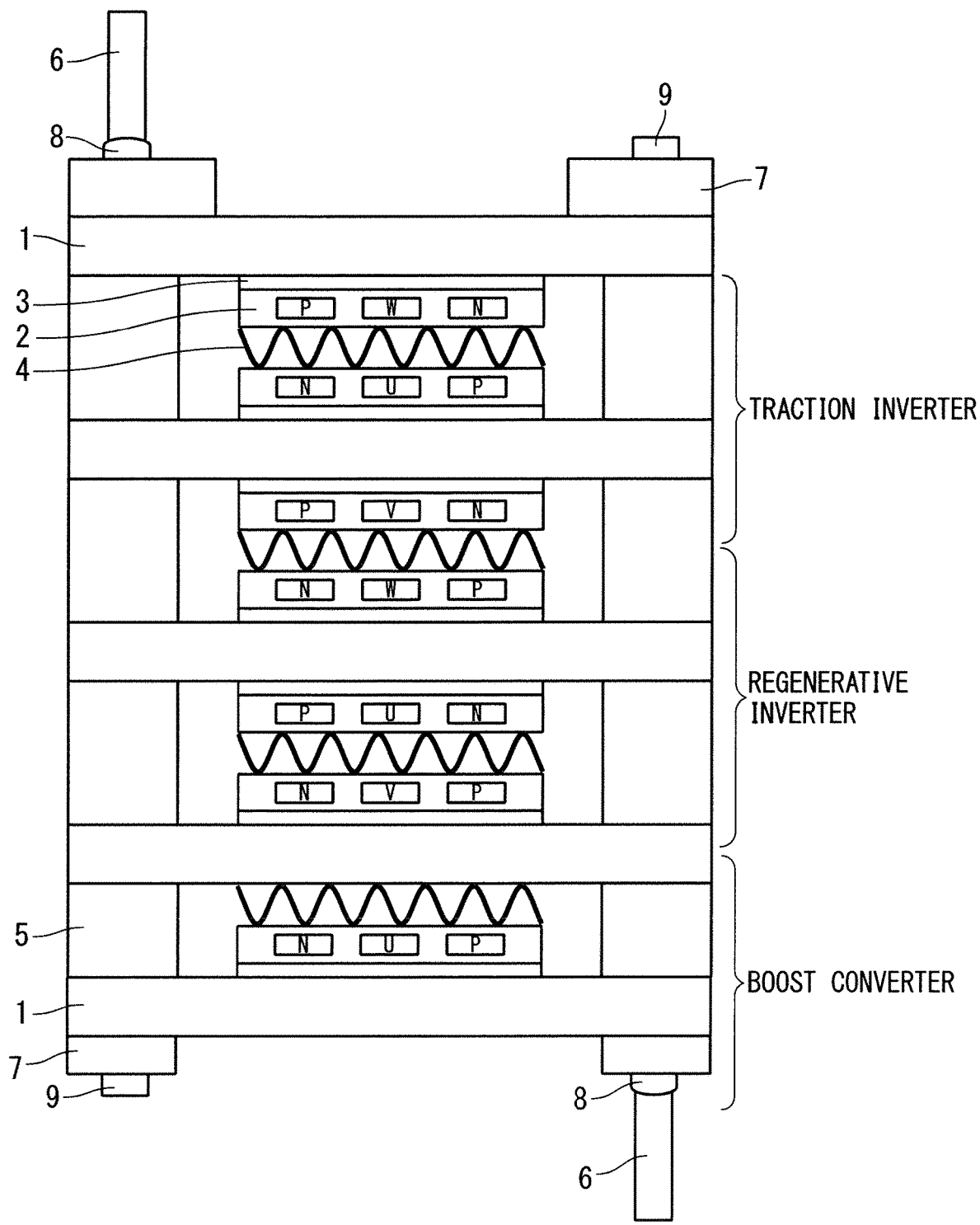
FIG. 27 illustrates an example structure of the semiconductor device according to the embodiment of the present invention.

As illustrated in FIG. 27, the positions of the pipes 6 are arbitrarily changeable. In the example of FIG. 27, the coolant flows into the lower pipe 6, and flows from the upper pipe 6. This structure can arbitrarily select the coolant passages.

Modification 10

The semiconductor package 2 may include a semiconductor element that contains SiC as a main component. Here, the main component is a component whose proportion to the total is extraordinarily higher than that of a non-main component, for example, a component whose proportion is several tens of times higher than that of the non-main component.

Modification 11

The cooling plate 1 may include the coolant passage 11 in the stacking direction, and need not include the coolant passage 11 in a direction vertical to the stacking direction. Specifically, the cooling plate 1 does not include the coolant passage 11 in a portion with the cooling fin 13 in FIG. 4. Here, the cooling plate 1 is formed of a material with a greater rigidity such as iron. Furthermore, this cooling plate 1 may be a part of the plurality of cooling plates 1 to be stacked.

This structure can increase the mechanical strength of the stacked structure.

Modification 12

Figure 28:
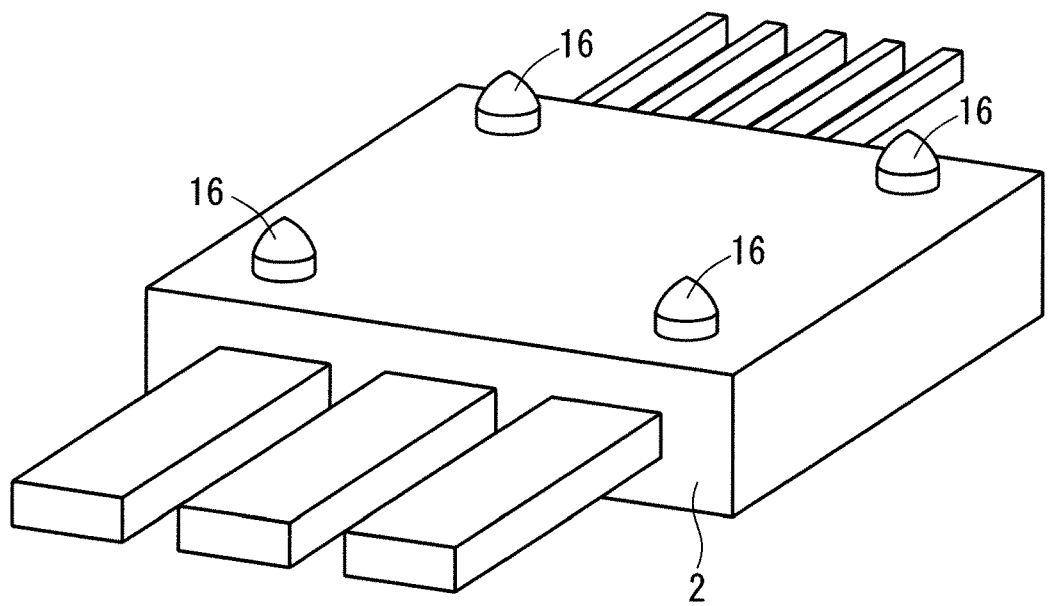
FIG. 28 illustrates an example semiconductor package according to the embodiment of the present invention.

As illustrated in FIG. 28, the semiconductor package 2 may include protruding parts 16 that define the position of the spring plate 4. The protruding parts 16 are formed when the semiconductor package 2 is transfer molded. This structure enables the positioning of the spring plate 4.

Modification 13

Figure 29:
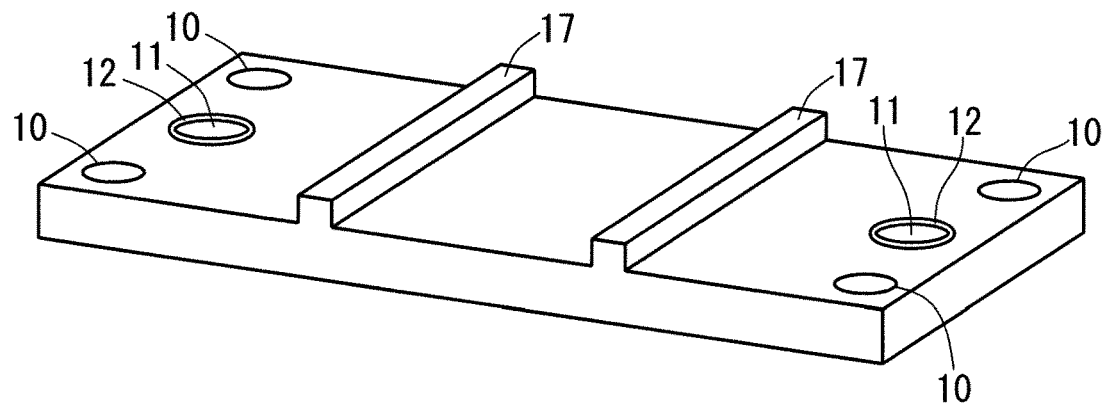
FIG. 29 illustrates an example cooling plate according to the embodiment of the present invention.
Figure 30:
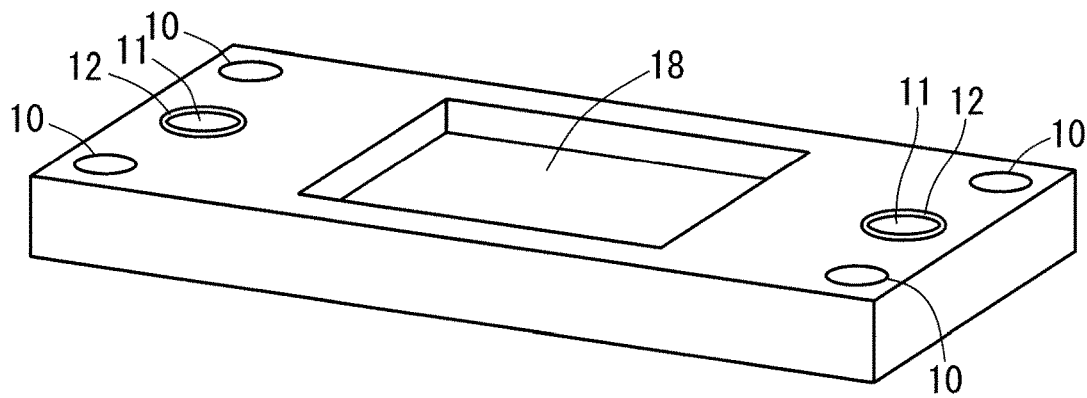
FIG. 30 illustrates an example cooling plate according to the embodiment of the present invention.

As illustrated in FIG. 29, the cooling plate 1 may include protruding parts 17 that define the position of the semiconductor package 2. As illustrated in FIG. 30, the cooling plate 1 may include a recess 18 that defines the position of the semiconductor package 2.

These structures enable the positioning of the semiconductor package 2.

The embodiment can be appropriately modified or omitted within the scope of the invention.

Although this invention has been described in detail, the description is in all aspects illustrative and does not restrict the invention. It is therefore understood that numerous modifications and variations can be devised without departing from the scope of the invention.

EXPLANATION OF REFERENCE SIGNS 1 cooling plate, 2 semiconductor package, 3 thermal grease, 4 spring plate, 5 spacer, 6 pipe, 7 lid, 8 screw, 9 nut, 10 screw hole, 11 coolant passage, 12 O-ring, 13 cooling fin, 14 recess, 15 rib, 16 protruding part, 17 protruding part, 18 recess.

The invention claimed is:

1. A semiconductor device, comprising:
a plurality of cooling plates each having a coolant passage inside, the plurality of cooling plates including a first cooling plate and a second cooling plate;
spacers disposed to stack the cooling plates with spaces;
at least one semiconductor package disposed on a principal surface of the first cooling plate; and
a spring plate disposed between the at least one semiconductor package and the second cooling plate and directly contacting the second cooling plate, the spring plate biasing the at least one semiconductor package toward the first cooling plate.

2. The semiconductor device according to claim 1, wherein
the plurality of cooling plates includes coolant passages in the stacking direction and in a direction vertical to the stacking direction.

3. A semiconductor device, comprising:
a plurality of cooling plates each having a coolant passage inside;
spacers disposed to stack the cooling plates with spaces;
at least one semiconductor package disposed on at least one principal surface of at least one of the cooling plates; and
a spring plate disposed between adjacent ones of the cooling plates, the spring plate biasing the at least one semiconductor package toward the cooling plates, wherein highest and lowest cooling plates among the cooling plates are more rigid than the other cooling plates.

4. The semiconductor device according to claim 1, wherein
the at least one semiconductor package includes a 2-in-1 package including an upper arm circuit and a lower arm circuit.

5. The semiconductor device according to claim 1, wherein
the at least one semiconductor package includes a 1-in-1 package including one of an upper arm circuit and a lower arm circuit.

6. The semiconductor device according to claim 1, wherein
the at least one semiconductor package comprises a plurality of semiconductor packages disposed on principal surfaces of the cooling plates.

7. The semiconductor device according to claim 1, wherein
the number of the cooling plates to be stacked is variable.

8. The semiconductor device according to claim 1, wherein
the at least one semiconductor package has an insulating layer inside.

9. The semiconductor device according to claim 1, further comprising
an insulating substrate between the at least one semiconductor package and one of the cooling plates.

10. The semiconductor device according to claim 1, wherein
the spring plate is corrugated.

11. The semiconductor device according to claim 10, wherein
the spring plate is corrugated in a direction parallel to the stacking direction.

12. The semiconductor device according to claim 10, wherein
the spring plate is corrugated in a direction vertical to the stacking direction.

13. The semiconductor device according to claim 1, wherein
the at least one semiconductor package comprises a plurality of semiconductor packages disposed in the stacking direction, and
main terminals of the plurality of semiconductor packages are aligned in the stacking direction.

14. The semiconductor device according to claim 1, wherein
the cooling plates include a recess with a surface on which the at least one semiconductor package is disposed and to which grease is applied.

15. The semiconductor device according to claim 1, wherein the cooling plates include at least one rib.

16. The semiconductor device according to claim 1, further comprising
a pipe that supplies a coolant to each of the coolant passages of the cooling plates.

17. The semiconductor device according to claim 1, wherein
the at least one semiconductor package includes a semiconductor element that contains SiC as a main component.

18. The semiconductor device according to claim 1, wherein
the plurality of cooling plates includes a coolant passage in the stacking direction, and does not include the coolant passage in a direction vertical to the stacking direction.

19. The semiconductor device according to claim 1, wherein
the at least one semiconductor package includes at least one protruding part that defines a position of the spring plate.

20. The semiconductor device according to claim 1, wherein
each of the cooling plates includes a recess or at least one protruding part that defines a position of the at least one semiconductor package.

21. A method for manufacturing the semiconductor device according to claim 1, the method comprising the steps of:
(a) preparing the plurality of cooling plates including the at least one of the cooling plates including the at least one semiconductor package disposed on the at least one principal surface of the at least one of the cooling plates; and
(b) disposing the spring plate on the at least one semiconductor package, and stacking the plurality of cooling plates through the spacers.

\* \* \* \* \*